(12) United States Patent
Tiwari et al.

(10) Patent No.: US 11,522,521 B2
(45) Date of Patent: Dec. 6, 2022

(54) GLITCH FILTER HAVING A SWITCHED CAPACITANCE AND RESET STAGES

(71) Applicant: STMicroelectronics International N.V., Geneva (CH)

(72) Inventors: Manoj Kumar Tiwari, Unnao (IN); Saiyid Mohammad Irshad Rizvi, New Delhi (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/223,963

(22) Filed: Apr. 6, 2021

(65) Prior Publication Data
US 2021/0336606 A1 Oct. 28, 2021

Related U.S. Application Data

(60) Provisional application No. 63/016,753, filed on Apr. 28, 2020.

(51) Int. Cl.
*H03H 11/04* (2006.01)
*H03H 19/00* (2006.01)
*G06F 1/10* (2006.01)

(52) U.S. Cl.
CPC .............. *H03H 11/04* (2013.01); *G06F 1/10* (2013.01); *H03H 19/004* (2013.01)

(58) Field of Classification Search
CPC .......... H03K 5/1252; H03K 19/00361; H03K 5/133; H03K 5/135; H03K 3/012; H03K 17/22; H03K 19/20; H03K 17/6872; H03K 5/2481; H03K 5/19; H03H 19/002; H03H 19/004; H03H 19/006; H03H 19/008; H03F 3/005; H03F 3/45475; H03F 1/02
See application file for complete search history.

(56) References Cited

U.S. PATENT DOCUMENTS

| | | | |
|---|---|---|---|
| 5,689,201 A * | 11/1997 | Temes | G11C 27/026 327/95 |
| 6,118,399 A * | 9/2000 | Krone | H03M 3/376 341/145 |
| 6,441,762 B2 | 8/2002 | Angelici et al. | |
| 7,397,292 B1 | 7/2008 | Potanin | |
| 7,795,959 B2 | 9/2010 | Chen et al. | |

(Continued)

OTHER PUBLICATIONS

Deng et al., "A 5-GHz CMOS Frequency Synthesizer With an Injection-Locked Frequency Divider and Differential Switched Capacitors," *IEEE Transactions on Circuits and Systems—1: Regular Papers* 56(2), pp. 320-326, Feb. 2009, (7 pages).

*Primary Examiner* — John W Poos
(74) *Attorney, Agent, or Firm* — Seed IP Law Group LLP (57) ABSTRACT

A glitch filter is provided. The glitch filter receives an input signal and sets a voltage level of an intermediary input node in accordance with a state of the input signal. The glitch filter charges or discharges a switched capacitance based on the voltage level of the intermediary input node and charges or discharges a filter capacitance based on a charge of the switched capacitance. The glitch filter sets a state of an output signal based on the charge of the filter capacitance. The glitch filter includes a reset stage that at least partially filters a burst of glitches in the input signal from the output signal by controlling the charge of the switched capacitance based on the state of the input signal and the state of the output signal.

18 Claims, 5 Drawing Sheets

(56) References Cited

U.S. PATENT DOCUMENTS

| | | | | |
|---|---|---|---|---|
| 7,920,022 B2* | 4/2011 | Josefsson | ............ | H03F 1/26 |
| | | | | 330/9 |
| 2011/0279148 A1* | 11/2011 | Watanabe | ............ | G11C 27/026 |
| | | | | 327/96 |
| 2019/0229709 A1* | 7/2019 | Gupta | ............ | H03H 19/004 |

* cited by examiner

GLITCH FILTER HAVING A SWITCHED CAPACITANCE AND RESET STAGES

BACKGROUND

Technical Field

This application relates to a glitch filter and, in particular, a glitch filter that includes a switched capacitance and reset stages, and that filters glitches or signal transitions within a specified band.

Description of the Related Art

Glitch filters are used to filter out glitches, which are erroneous or unwanted state transitions in a signal. Process variation may affect the operation of glitch filters and introduce uncertainty in the operation parameters of a glitch filter. For example, when a resistance-capacitance (RC) filter of a glitch filter is implemented, process variation can cause the time constant of the RC filter to vary between 50% and 150%.

BRIEF SUMMARY

A glitch filter is provided. The glitch filter mitigates, removes or filters out glitches from an input signal. To reduce process variation induced by formulating a circuit resistance, the glitch filter provided herein utilizes a switched capacitance. In one or more embodiments, the glitch filter also includes switching stages coupled to the switched capacitance. The switching stages operate to charge or discharge the switched capacitance and a filter capacitance and filter out glitches or signal transitions shorter than a duration of time.

In one or more embodiments, to mitigate bursts of glitches (for example, with each glitch being shorter than the duration of time), the glitch filter includes two reset stages respectively coupled to the switched capacitance and the filter capacitance. When glitches occur in bursts (e.g., multiple consecutive glitches), the glitches have the capability to propagate through the glitch filter and manifest in the output of the glitch filter. To mitigate a burst of glitches, each reset stage receives both the input and output signals of the glitch filter. In a steady state condition of operation, the input and output signals have the same state. When a burst of glitches occurs in the input signal, the input signal fluctuates between states for a period of time. The reset stages detect the fluctuation in the input signal. Whenever the input signal experiences a glitch (of a burst of glitches) and then recovers from the glitch back to its initial state, the reset stages reset the charge on the capacitances in response to the input signal recovering or reverting back to its initial state.

Therefore, as the burst of glitches occurs, with every cyclical transition between a glitch in the input signal and non-glitch, the reset stages charge or discharge the switched capacitance and the filter capacitance to prevent the glitch from propagating through to the output of the glitch filter.

DETAILED DESCRIPTION

Figure 1:
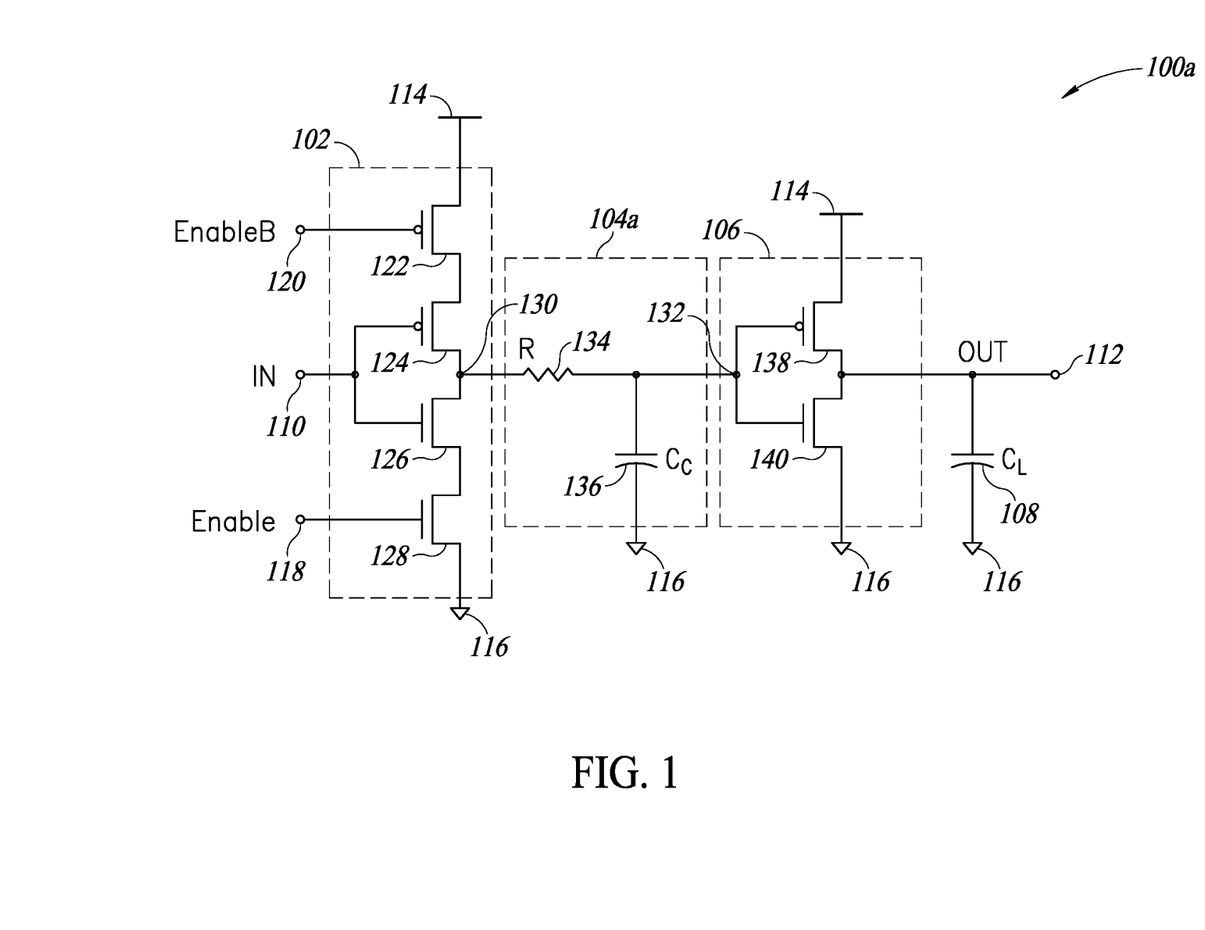
FIG. 1 shows a circuit schematic of a conventional glitch filter.

FIG. 1 shows a circuit schematic of a conventional glitch filter 100a. The glitch filter 100a includes an input stage 102, a resistance-capacitance (RC) filter 104a, an output stage 106 and an output capacitance 108 (denoted '$C_L$'). The glitch filter 100a is coupled between an input node 110, an output node 112, voltage supply nodes 114, ground nodes 116, an enable node 118 and a complementary enable node 120.

The input node 110 supplies an input signal (IN) to the glitch filter 100a and the output node 112 supplies an output signal (OUT) of the glitch filter 100a. The voltage supply nodes 114 each provide a supply voltage (e.g., positive voltage) to the glitch filter 100a and the ground nodes 116 each provide a ground voltage to the glitch filter 100a. The supply and ground voltages may alternatively be any two reference voltages of the glitch filter 100a. The enable and complementary enable nodes 118, 120 may supply an enable signal (Enable) and a complementary enable signal (EnableB), respectively.

The complementary enable signal may be an inversion of the enable signal and may have an opposite state (or logical value) to that of the enable signal. When the enable signal (Enable) is asserted (activated, turned on, has a state of logical one or has a supply voltage level) and the complementary enable signal (EnableB) is deasserted (deactivated, turned off, has a state of logical zero or has a ground voltage level), the glitch filter 100a operates to filter out glitches from the input signal (IN) and provide the output signal (OUT) having the glitches removed or filtered out therefrom. Conversely, when the enable signal (Enable) is deasserted and the complementary enable signal (EnableB) is asserted, the glitch filter 100a does not operate on the input signal (IN). A controller (not shown) of the glitch filter 100a may control operation of the glitch filter 100a and may provide the enable signal (Enable) or the complementary enable signal (EnableB). The controller, glitch filter 100a or another circuit may invert the enable signal (Enable) or the complementary enable signal (EnableB) to produce the complementary signal thereof.

It is noted that herein, a signal or a node are interchangeably referred to as: asserted, activated, turned on, high, having a state of logical one or having a supply voltage level. A signal or a node are interchangeably referred to as: deasserted, deactivated, turned off, low, having a state of logical zero or having a ground voltage level. However, alternative conventions may be used where a state of logical one or a supply voltage level is indicative of a signal or a node being deasserted, deactivated or turned off and a state of logical zero or a ground voltage level is indicative of a signal or a node being asserted, activated or turned on.

The input stage 102 includes first, second, third and fourth input transistors 122, 124, 126, 128 with two input transistors 122, 124 being pull-up transistors and two transistors 126, 128 being pull-down transistors. The first transistor 122 has a first conductive terminal coupled to a voltage supply node 114 and a control terminal coupled to the complementary enable node 120 and configured to receive the complementary enable signal (EnableB). The first transistor 122 has a second conductive terminal. The second transistor 124 has a first conductive terminal coupled to the second conductive terminal of the first transistor 122 and a control terminal coupled to the input node 110 and configured to receive the input signal (IN). The second transistor 124 has a second conductive terminal coupled to an intermediary input node 130.

The third transistor 126 of the input stage 102 has a first conductive terminal coupled to the intermediary input node 130 and a control terminal coupled to the input node 110 and configured to receive the input signal (IN). The third transistor 126 has a second conductive terminal. The fourth transistor 128 has a first conductive terminal coupled to the second conductive terminal of the third transistors 126 and a control terminal coupled to the enable node 118 and configured to receive the enable signal (Enable). The fourth transistor 128 has a second conductive terminal coupled to a ground node 116.

The RC filter 104a is coupled between the intermediary input node 130 and an intermediary output node 132. The RC filter 104a includes a resistance 134 (R) and a filter capacitance 136 ($C_C$). The resistance 134 has a first terminal coupled to the intermediary input node 130 and the second terminal coupled to the intermediary output node 132. The filter capacitance 136 has a first side coupled to the intermediary output node 132 and a second side coupled to a ground node 116.

The output stage 106 is coupled between the intermediary output node 132 and the output node 112. The output stage 106 includes first and second output transistors 138, 140. The first output transistor 138 has a first conductive terminal coupled to a voltage supply node 114, a control terminal coupled to the intermediary output node 132 and a second conductive terminal coupled to the output node 112. The second output transistor 140 has a first conductive terminal coupled to the output node 112, a control terminal coupled to the intermediary output node 132 and a second conductive terminal coupled to a ground node 116. The output capacitance 108 is coupled between the output node 112 and the ground node 116.

During operation, the glitch filter 100a receives the input signal (IN) and the input stage 102. When operation is enabled (the enable signal (Enable) is asserted and the complementary enable signal (EnableB) is the deasserted), the input stage 102 operates as an inverting input stage. The input stage 102 sets the state of the intermediary input node 130 to a complementary state of the input signal (IN). For example, when the input signal (IN) is a logical one, the input stage 102 pulls the intermediary input node 130 down to ground voltage (logical zero), and when the input signal (IN) is a logical one, the input stage 102 pulls the intermediary input node 130 up to the reference voltage (logical one).

Due to the inversion performed by the input stage 102, the RC filter 104a operates on a complementary state of the input signal (IN). The output stage 106 reverses the inversion performed by the input stage 102. Accordingly, the output signal (OUT) follows the same convention as the input signal. It is noted that in alternative embodiments, the input and output stages 102, 106 may not perform inversion. The RC filter 104a may operate on the same state as the input signal (IN).

The RC filter 104a filters glitches from input signal (IN) as reflected on the intermediary input node 130. The RC filter 104a presents an output on the intermediary output node 132 having glitches at least partially mitigated or filtered or removed therefrom.

The output stage 106 operates as an inverting output stage to counteract the inversion taking place at the input stage 102. When the voltage of the intermediary output node 132 has a logical zero state, the output stage 106 pulls up the output node 112 to the supply voltage provided by a supply voltage node 114. Thus, the output node 112 has a logical one state. Conversely, when the voltage of the intermediary output node 132 has a logical one state, the output stage 106 pulls down the output node 112 to the ground voltage provided by a ground node 114. Thus, the output node 112 has a logical zero state. The output capacitance 108 stores the state of the output node 112. The output signal (OUT) is taken at the output node 112.

The time constant of the RC filter 104a may be represented as:

$$\tau = RC_C. \qquad \text{Equation (1)}$$

Due to process variation the time constant of the RC filter 104a may vary with a range of 50% to 150%. To mitigate the process variation, the resistance 134 may be replaced with a switched capacitance. After substituting for the resistance 134 with the switched capacitance, the time constant of the RC filter 104a may be represented as:

$$\tau = \frac{1}{2\pi f C_R} C_C = \frac{C_C}{2\pi f C_R} = \frac{1}{2\pi f} \frac{C_C}{C_R}, \qquad \text{Equation (2)}$$

where f is the frequency and $C_R$ is the capacitance of the switched capacitance.

The process variation similarly affects the filter capacitance 136 ($C_C$) of the RC filter 104a and the switched capacitance ($C_R$) used to model the resistance 134 (R). Accordingly, per Equation (2) and per the division of filter capacitance 136 ($C_C$) by the switched capacitance ($C_R$), the process variations of the capacitances ($C_C$, $C_R$) "cancel each other out," and the process variation is decoupled from the time constant ($\tau$) of the switched capacitance filter.

Figure 2:
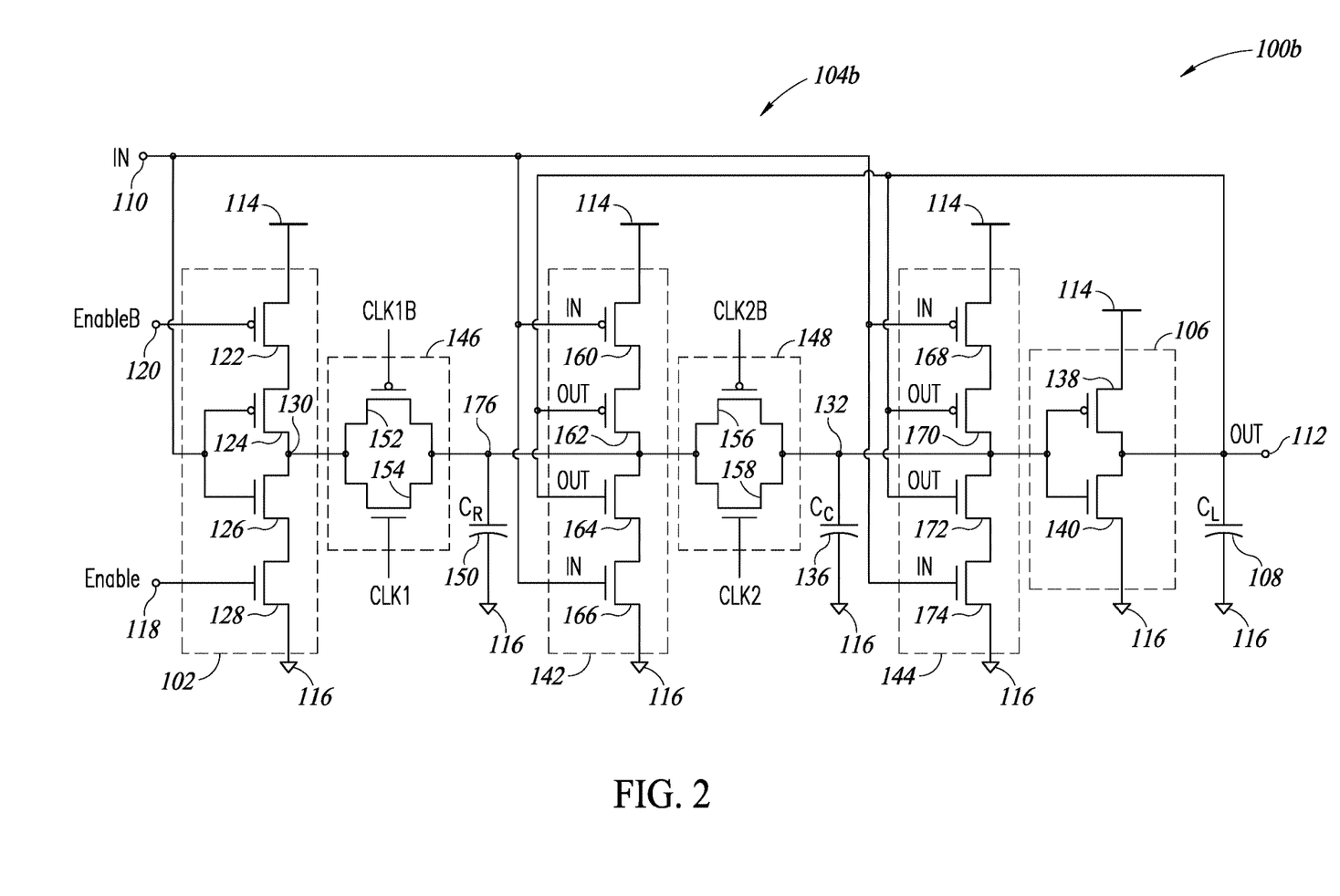
FIG. 2 shows a circuit schematic of a glitch filter in accordance with an embodiment.

FIG. 2 shows a circuit schematic of a glitch filter 100b in accordance with an embodiment. Similar elements of the glitch filter 100b as those of the glitch filter 100a described with reference to FIG. 1 have the same reference numerals. The glitch filter 100b includes the input stage 102, a switched capacitance filter 104b, first and second reset stages 142, 144, the output stage 106 and the output capacitance 108. The glitch filter 100b may filter glitches or signal transitions within a specified band, such as signal transitions shorter than 50 nanoseconds (ns).

The switched capacitance filter 104b includes a first switching stage 146, a second switching stage 148 and a switched capacitance 150. The first switching stage 146 includes a first switching transistor 152 and a second switching transistor 154. The second switching stage 146 includes a first switching transistor 156 and a second switching transistor 158. The first reset stage 142 includes first, second, third and fourth reset transistors 160, 162, 164, 166, and the second reset stage 144 includes first, second, third and fourth reset transistors 168, 170, 172, 174.

In the first switching stage 146, the first switching transistor 152 has a first conduction terminal coupled to the intermediary input node 130 and a second conduction terminal coupled to a switched capacitance node 176. The first switching transistor 152 has a control terminal configured to receive a complementary first clock signal (CLK1B). The complementary first clock signal (CLK1B) has the opposite state of a first clock signal (CLK1). The second switching transistor 154 has a first conduction terminal coupled to the intermediary input node 130 and a second conduction terminal coupled to the switched capacitance node 176. The second switching transistor 154 has a control terminal configured to receive the first clock signal (CLK1).

In the first reset stage 142, the first and second reset transistors 160, 162 are in a pull-up configuration and the third and fourth reset transistors 164, 166 are in a pull-down configuration. The first and second reset transistors 160, 162 are coupled in series between a voltage supply node 114 and the switched capacitance node 176. The third and fourth reset transistors 164, 166 are coupled in series between the switched capacitance node 176 and a ground node 116. The first reset transistor 160 has a first conductive terminal coupled to a voltage supply node 114 and a control terminal coupled to the input node 110. The first reset transistor 160 has a second conductive terminal. The second reset transistor 162 has a first conductive terminal coupled to the second conductive terminal of the first reset transistor 160, a second conductive terminal coupled to the switched capacitance node 176 and a control terminal coupled to the output node 112.

The third reset transistor 164 has a first conductive terminal coupled to the switched capacitance node 176 and a control terminal coupled to the output node 112. The third reset transistor 164 has a second conductive terminal. The fourth reset transistor 166 has a first conductive terminal coupled to the second conductive terminal of the third reset transistor 164, a second conductive terminal coupled to a ground node 116 and a control terminal coupled to the input node 110. It is noted that the positions of the reset transistors 160, 162 may be reversed and the positions of the reset transistors 164, 166 may be reversed in some embodiments.

In the second switching stage 148, the first switching transistor 156 has a first conduction terminal coupled to the switched capacitance node 176 and a second conduction terminal coupled to the intermediary output node 132. The first switching transistor 156 has a control terminal configured to receive a complementary second clock signal (CLK2B). The complementary second clock signal (CLK2B) has the opposite state of a second clock signal (CLK2). The second switching transistor 158 has a first conduction terminal coupled to the switched capacitance node 176 and a second conduction terminal coupled to the intermediary output node 132. The second switching transistor 158 has a control terminal configured to receive the second clock signal (CLK1).

Like the first reset stage 142, in the second reset stage 144 the first and second reset transistors 168, 170 are in a pull-up configuration and the third and fourth reset transistors 172, 174 are in a pull-down configuration. The first and second reset transistors 168, 170 are coupled in series between a voltage supply node 114 and the intermediary output node 132. The third and fourth reset transistors 172, 174 are coupled in series between the intermediary output node 132 and a ground node 116. The first reset transistor 168 has a first conductive terminal coupled to a voltage supply node 114 and a control terminal coupled to the input node 110. The first reset transistor 168 has a second conductive terminal. The second reset transistor 170 has a first conductive terminal coupled to the second conductive terminal of the first reset transistor 168, a second conductive terminal coupled to the intermediary output node 132 and a control terminal coupled to the output node 112.

The third reset transistor 172 has a first conductive terminal coupled to the intermediary output node 132 and a control terminal coupled to the output node 112. The third reset transistor 172 has a second conductive terminal. The fourth reset transistor 174 has a first conductive terminal coupled to the second conductive terminal of the third reset transistor 172, a second conductive terminal coupled to a ground node 116 and a control terminal coupled to the input node 110. It is noted that the positions of the reset transistors 168, 170 may be reversed and the positions of the reset transistors 172, 174 may be reversed in some embodiments.

During operation, the input stage 102 passes the complementary state of the input signal (IN) to the intermediary input node 130 as described with reference to FIG. 1. The input stage 102 pulls up or down the intermediary input node 130 to the complementary state of the input signal (IN). When the input signal (IN) is logical one, the input stage 102 couples the intermediary input node 130 to the ground node 116. Conversely, when the input signal (IN) is logical zero, the input stage 102 couples the intermediary input node 130 to the voltage supply node 114.

The first switching stage 146 operates in either a conductive state or nonconductive state depending on the state of the first clock signal (CLK1). When the first switching stage 146 is in the conductive state, the first switching stage 146 charges or discharges the switched capacitance 150 based on a voltage level of the intermediary input node 130. When the first clock signal (CLK1) is asserted, the first switching stage 146 is conductive thereby shorting the switched capacitance node 176 and the intermediary input node 130. The charge stored by the switched capacitance 150 represents the complementary state of the input signal (IN). When the first clock signal (CLK1) becomes deasserted, the first switching stage 146 is nonconductive thereby isolating the switched capacitance node 176 from the intermediary input node 130. The charge stored by the switched capacitance 150 is decoupled from the state of the input signal (IN).

Whereas the first switching stage 146 operates based on the first clock signal (CLK1), the second switching stage 148 operates based on the second clock signal (CLK2). The first and second clock signals (CLK1, CLK2) are on at different times as described with reference to FIG. 3. Accordingly, the first and second switching stages 146, 148 are conductive at different times.

Figure 3:
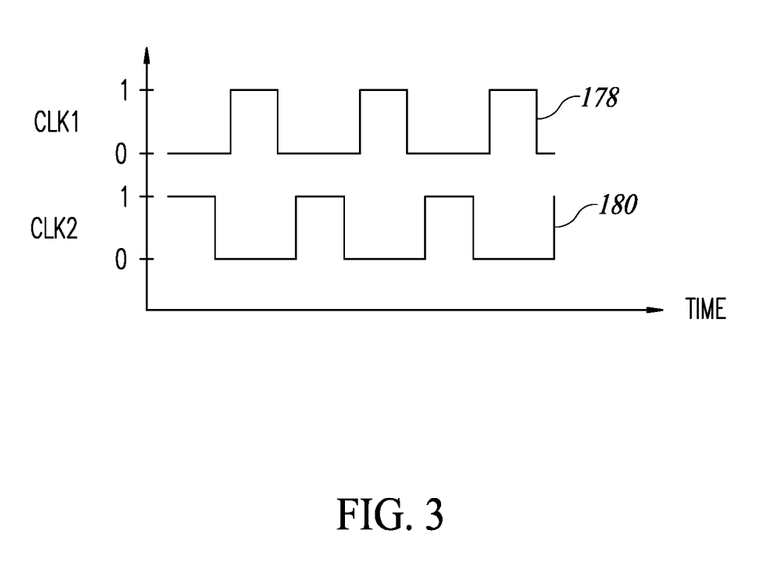
FIG. 3 shows an example of first and second clock signals used to drive first and second switching stages, respectively, of the glitch filter.

FIG. 3 shows an example of the first and second clock signals 178, 180 (CLK1, CLK2) used to drive the first and second switching stages 146, 148, respectively, of the glitch filter 100b. The first and second clock signals 178, 180 are asserted at different times. In addition, between periods of time when the first and second clock signals 178, 180 are asserted there is a dead time during which neither the first clock signal 178 nor the second clock signal 180 is asserted.

Referring back to FIG. 2, when the first clock signal (CLK1) transitions from being asserted to deasserted, the switched capacitance node 176 stores a charge representative of the charge of the intermediary input node 130. The second switching stage 148 remains nonconductive for a duration of the dead time. When the second clock signal (CLK2) becomes asserted, the first and second switching transistors 156, 158 of the second switching stage 148 transition to the conductive state. Thus, the second switching stage 148 becomes conductive. The charge stored on the switched capacitance node 176 is transferred to the intermediary output node 132 and becomes stored on the filter capacitance 136.

The output stage 106, which functions as an inverting output stage, pulls the output node 112 up to the supply voltage or down to the ground voltage. The output stage 106 sets the voltage of the output node 112 to a complementary state compared to that of the intermediary output node 132. The glitch filter 100b filters glitches in the input signal (IN) by charging or discharging the capacitances 150, 136 and transferring charges between the intermediary input node 130, the switched capacitance node 176 and the intermediary output node 132.

The first and second reset stages 142, 144 operate to filter and mitigate a series or burst of glitches in the input signal (IN). When the input signal (IN) has the same state as the output signal (OUT), the first and second reset stages 142, 144 reset the switched capacitance node 176 and the intermediary output node 132, respectively, to a complementary state of the input signal (IN) and the output signal (OUT). Conversely, when the input signal (IN) has a different state than the output signal (OUT), the first and second reset stages 142, 144 do not reset or alter the states of the switched capacitance node 176 and the intermediary output node 132.

When the input signal (IN) includes one or more bursts of glitches, the switch capacitance node 176 may become a floating node. For example, initially the input signal (IN) may have a state of logical zero and the output signal (OUT) also has a state of logical zero. The input signal (IN) may then experience a burst of glitches that cause it to alternate between a state of logical zero and logical one. Due to the burst of glitches and while the first switching stage 146 is conductive, the switch capacitance 150 is charged and discharged as the input signal alternates between a state of logical zero and logical one. When the first switching stage 146 becomes nonconductive, the switch capacitance node 176 becomes a floating node and its charge is isolated from the input stage 102. As the input signal (IN) alternates between logical zero and logical one due to the burst of glitches, the first reset stage 142 pulls up the switch capacitance node 176 to the supply voltage. The first reset stage 142 pulls up the switch capacitance node 176 during times in the burst when the input signal (IN) has a logical state of zero matching the output signal (OUT), which remains at logical zero. During the periods of time when the alternating input signal is at logical zero, the first reset stage 142 forces the switch capacitance node 176 to logical one (an opposite state of the output signal (OUT)). In effect, the first reset stage 142 locks the charge of the switched capacitance 150 to a state corresponding to the state of the output signal.

Similarly, the second reset stage 144 ensures that, when the input and output signals (IN, OUT) have the same state, the charge stored on the filter capacitance 136 corresponds to the state of the input and output signals (IN, OUT). If a glitch in the input signal (IN) propagates from the switched capacitance node 176 to the intermediary output node 132, the second reset stage 144 resets (by charging or discharging) the charge stored on the filter capacitance 136. The second reset stage 144 restores the charge stored on the filter capacitance 136 to a charge that corresponds to the input and output signals (IN, OUT). The charges of the switched capacitance 150 and the filter capacitance 136 are controlled to at least partially filter a burst of glitches in the input signal (IN) from the output signal (OUT) based on the state of the input signal and the state of the output signal.

Figure 4:
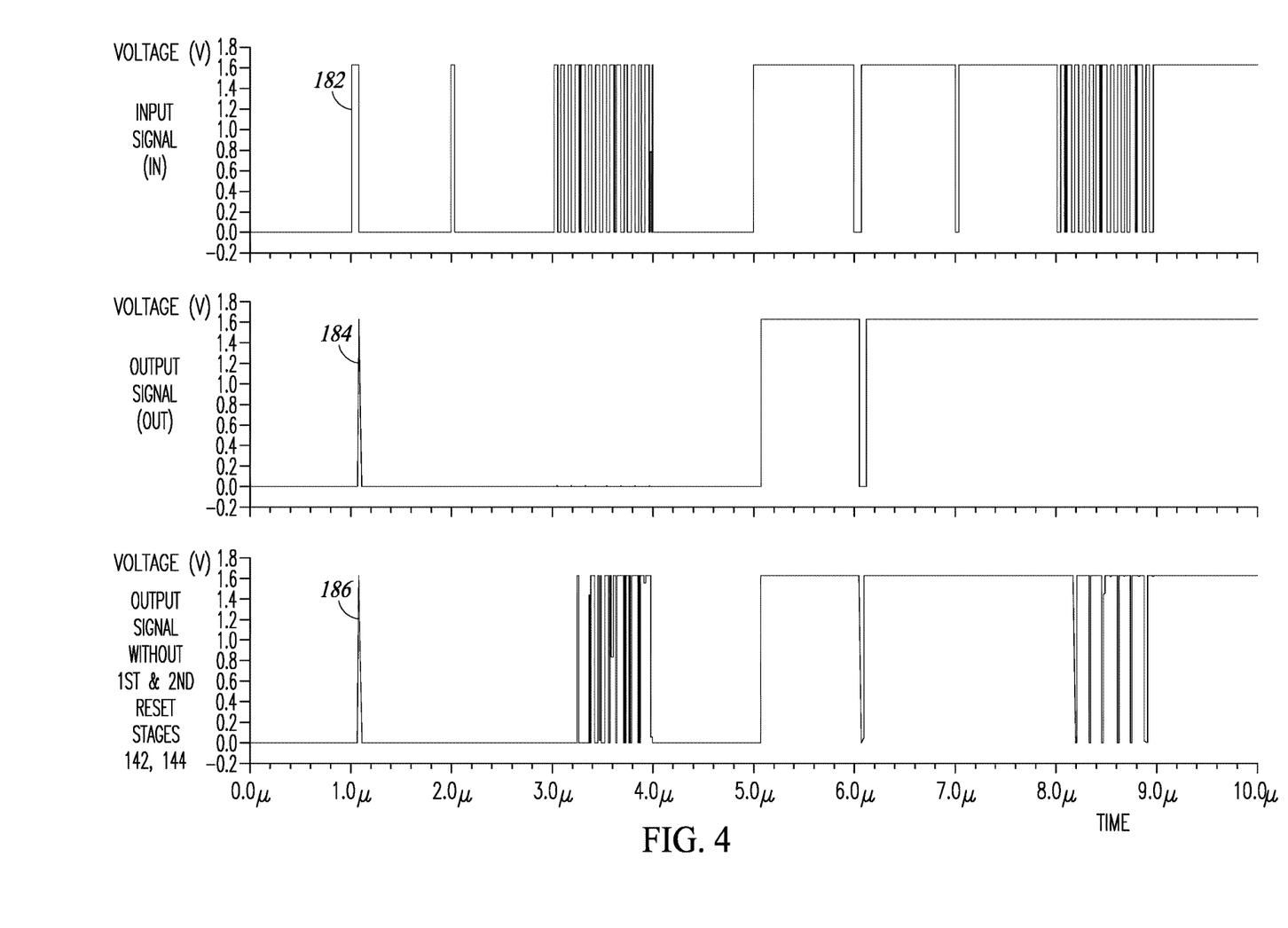
FIG. 4 shows signal diagrams of an input signal (IN), an output signal (OUT) of the glitch filter and an output signal (OUT) of a glitch filter not employing first and second reset stages.

FIG. 4 shows signal diagrams of the input signal (IN) 182, the output signal (OUT) 184 of the glitch filter 100b and the output signal (OUT) 186 of a glitch filter not employing the first and second reset stages 142, 144. The input signal (IN) 182 includes state changes (at 1 and 6 microseconds (μs)) having a duration of 50 nanoseconds (ns). The input signal (IN) also includes bursts of 35 ns glitches beginning at 3 and 8 μs and individual 35 ns glitches at 2 and 7 μs.

The glitch filter 100b filters glitches or any pulse changes having a duration of less than 50 ns. Accordingly, the glitch filter 100b passes, in the output signal (OUT) 184, the state changes at 1 and 6 μs. The glitch filter 100b filters out the bursts of 35 ns glitches beginning at 3 and 8 μs and the individual 35 ns glitches at 2 and 7 μs. Operation of the first and second reset stages 142, 144 mitigates the bursts of 35 ns glitches beginning at 3 and 8 μs. The switched capacitance filter 104b filters and mitigates individual 35 ns glitches at 2 and 7 μs.

A glitch filter not employing the first and second reset stages 142, 144 passes some of the glitches of the bursts of 35 ns glitches at 3 and 8 μs to the output signal (OUT) 186 thereof. Use of the switched capacitance filter 104b filters and mitigates individual 35 ns glitches at 2 and 7 μs.

Figure 5:
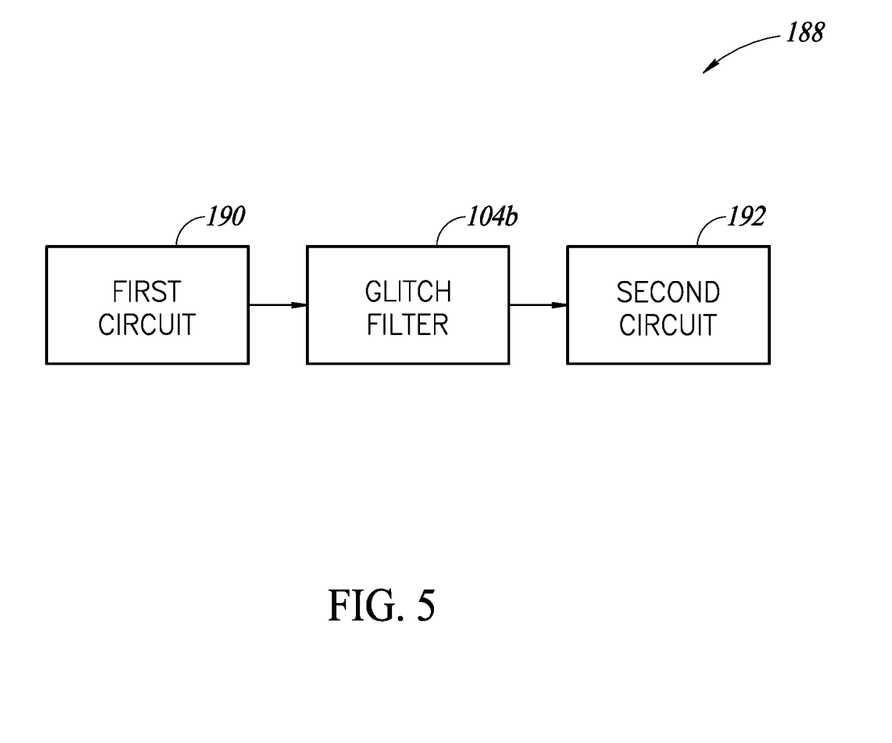
FIG. 5 shows a block diagram of a system including the glitch filter and first and second circuits.

FIG. 5 shows a block diagram of a system 188 including the glitch filter 100b and first and second circuits 190, 192. The first circuit 190 may send data to the second circuit 192 in accordance with any protocol, such as the Inter-Integrated Circuit (I2C) protocol. Some protocols call for suppressing or filtering signal transitions having a certain duration, such as signal transitions having a duration less than 50 ns.

In FIG. 5, the first circuit 190 may be a processor and the second circuit 192 may be a peripheral device, such as a transmitter or receiver, among other. To meet the signaling requirement for the protocol, the glitch filter 100b may be employed in the communication path between the first and second circuits 190, 192. The first circuit 190 provides the input signal (IN) to the glitch filter 100b. The glitch filter 100b filters the input signal (IN) as described herein and provides the output signal (OUT) to the second circuit 192. The glitch filter 100b suppresses, in the output signal (OUT), glitches present in the input signal (IN).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A glitch filter, comprising:
an input stage configured to:
  receive an input signal; and
  set a voltage level of an intermediary input node in accordance with a state of the input signal;
a switched capacitance filter including a switched capacitance and a filter capacitance and configured to:
  charge or discharge the switched capacitance based on the voltage level of the intermediary input node; and
  charge or discharge the filter capacitance based on a charge of the switched capacitance;
an output stage configured to:
  set a state of an output signal based on a charge of the filter capacitance;
a first reset stage configured to:
  at least partially filter a burst of glitches in the input signal from the output signal by controlling the charge of the switched capacitance based on the state of the input signal and the state of the output signal; and a second reset stage configured to:
at least partially filter the burst of glitches in the input signal from the output signal by controlling the charge of the filter capacitance based on the state of the input signal and the state of the output signal.

2. The glitch filter of claim 1, wherein the first reset stage includes:
first and second transistors connected in series between a voltage supply node and a first side of the switched capacitance, the first transistor having a control terminal configured to receive the input signal and the second transistor having a control terminal configured to receive the output signal; and
third and fourth transistors connected in series between the first side of the switched capacitance and a ground node, the third transistor having a control terminal configured to receive the output signal and the fourth transistor having a control terminal configured to receive the input signal.

3. The glitch filter of claim 1, wherein the second reset stage includes:
first and second transistors connected in series between a voltage supply node and a first side of the filter capacitance, the first transistor having a control terminal configured to receive the input signal and the second transistor having a control terminal configured to receive the output signal; and
third and fourth transistors connected in series between the first side of the filter capacitance and a ground node, the third transistor having a control terminal configured to receive the output signal and the fourth transistor having a control terminal configured to receive the input signal.

4. The glitch filter of claim 1, wherein the switched capacitance filter includes:
a first switching stage configured to:
receive a first clock signal;
when the first clock signal is asserted, operate in a conductive state to charge or discharge the switched capacitance in accordance with the state of the input signal; and
when the first clock signal is deasserted, operate in a nonconductive state to refrain from charging or discharging the switched capacitance in accordance with the state of the input signal.

5. The glitch filter of claim 4, wherein the switched capacitance filter includes:
a second switching stage configured to:
receive a second clock signal;
when the second clock signal is asserted, operate in a conductive state to charge or discharge the filter capacitance based on the charge of the switched capacitance; and
when the second clock signal is deasserted, operate in a nonconductive state to refrain from charging or discharging the filter capacitance based on the charge of the switched capacitance.

6. The glitch filter of claim 1, wherein the input stage is configured to:
receive an enable signal indicating whether operation of the glitch filter is enabled;
in response to the enable signal indicating that operation of the glitch filter is enabled, set the voltage level of the intermediary input node in accordance with the state of the input signal; and
in response to the enable signal indicating that operation of the glitch filter is disabled, refrain from setting the voltage level of the intermediary input node in accordance with the state of the input signal.

7. The glitch filter of claim 1, wherein the input stage includes:
first and second input transistors connected in series between a voltage supply node and the intermediary input node, the first input transistor having a control terminal configured to receive a complementary enable signal and the second input transistor having a control terminal configured to receive the input signal; and
third and fourth input transistors connected in series between the intermediary input node and a ground node, the third input transistor having a control terminal configured to receive the input signal and the fourth input transistor having a control terminal configured to receive an enable signal.

8. A system, comprising:
a first circuit configured to send a first signal;
a glitch filter including:
an input stage configured to:
receive the first signal; and
set a voltage level of an intermediary input node in accordance with a state of the first signal;
a switched capacitance filter including a switched capacitance and a filter capacitance and configured to:
charge or discharge the switched capacitance based on the voltage level of the intermediary input node; and
charge or discharge the filter capacitance based on a charge of the switched capacitance;
an output stage configured to:
set a state of a second signal based on a charge of the filter capacitance; and
output the second signal;
a first reset stage configured to:
at least partially filter a burst of glitches in the first signal from the second signal by controlling the charge of the switched capacitance based on the state of the first signal and the state of the second signal;
a second reset stage configured to:
at least partially filter the burst of glitches in the first signal from the second signal by controlling the charge of the filter capacitance based on the state of the first signal and the state of the second signal; and
a second circuit configured to receive the second signal.

9. The system of claim 8, wherein the first reset stage includes:
first and second transistors connected in series between a voltage supply node and a first side of the switched capacitance, the first transistor having a control terminal configured to receive the first signal and the second transistor having a control terminal configured to receive the second signal; and
third and fourth transistors connected in series between the first side of the switched capacitance and a ground node, the third transistor having a control terminal configured to receive the second signal and the fourth transistor having a control terminal configured to receive the first signal.

10. The system of claim 8, wherein the second reset stage includes:
first and second transistors connected in series between a voltage supply node and a first side of the filter capacitance, the first transistor having a control terminal configured to receive the first signal and the second transistor having a control terminal configured to receive the second signal; and third and fourth transistors connected in series between the first side of the filter capacitance and the ground node, the third transistor having a control terminal configured to receive the second signal and the fourth transistor having a control terminal configured to receive the first signal.

11. The system of claim 8, wherein the switched capacitance filter includes:
a first switching stage configured to:
receive a first clock signal;
when the first clock signal is asserted, operate in a conductive state to charge or discharge the switched capacitance in accordance with the state of the first signal; and
when the first clock signal is deasserted, operate in a nonconductive state to refrain from charging or discharging the switched capacitance in accordance with the state of the first signal.

12. The system of claim 11, wherein the switched capacitance filter includes:
a second switching stage configured to:
receive a second clock signal;
when the second clock signal is asserted, operate in a conductive state to charge or discharge the filter capacitance based on the charge of the switched capacitance; and
when the second clock signal is deasserted, operate in a nonconductive state to refrain from charging or discharging the filter capacitance based on the charge of the switched capacitance.

13. The system of claim 8, wherein the input stage is configured to:
receive an enable signal indicating whether operation of the glitch filter is enabled;
in response to the enable signal indicating that operation of the glitch filter is enabled, set the voltage level of the intermediary input node in accordance with the state of the first signal; and
in response to the enable signal indicating that operation of the glitch filter is disabled, refrain from setting the voltage level of the intermediary input node in accordance with the state of the first signal.

14. The system of claim 8, wherein the input stage includes:
first and second input transistors connected in series between a voltage supply node and the intermediary input node, the first input transistor having a control terminal configured to receive a complementary enable signal and the second input transistor having a control terminal configured to receive the first signal; and
third and fourth input transistors connected in series between the intermediary input node and a ground node, the third input transistor having a control terminal configured to receive the first signal and the fourth input transistor having a control terminal configured to receive an enable signal.

15. A method, comprising:
receiving, by an input stage, an input signal;
setting, by the input stage, a voltage level of an intermediary input node in accordance with a state of the input signal;
charging or discharging, by a switched capacitance filter, a switched capacitance based on the voltage level of the intermediary input node;
charging or discharging, by the switched capacitance filter, a filter capacitance based on a charge of the switched capacitance;
setting, by an output stage, a state of an output signal based on the charge of the filter capacitance;
at least partially filtering, by a first reset stage, a burst of glitches in the input signal from the output signal by controlling the charge of the switched capacitance based on the state of the input signal and the state of the output signal;
receiving, by a first switching stage, a first clock signal;
when the first clock signal is asserted, operating, by the first switching stage, in a conductive state to charge or discharge the switched capacitance in accordance with the state of the input signal; and
when the first clock signal is deasserted, operating, by the first switching stage, in a nonconductive state to refrain from charging or discharging the switched capacitance in accordance with the state of the input signal.

16. The method of claim 15, comprising:
at least partially filtering the burst of glitches in the input signal from the output signal by controlling the charge of the filter capacitance based on the state of the input signal and the state of the output signal.

17. The method of claim 15, comprising:
receiving, by a second switching stage, a second clock signal;
when the second clock signal is asserted, operating, by the second switching stage, in a conductive state to charge or discharge the filter capacitance based on the charge of the switched capacitance; and
when the second clock signal is deasserted, operating, by the second switching stage, in a nonconductive state to refrain from charging or discharging the filter capacitance based on the charge of the switched capacitance.

18. The method claim 15, comprising:
receiving, by the input stage, an enable signal indicating whether operation of a glitch filter is enabled;
in response to the enable signal indicating that operation of the glitch filter is enabled, setting, by the input stage, the voltage level of the intermediary input node in accordance with the state of the input signal; and
in response to the enable signal indicating that operation of the glitch filter is disabled, refraining, by the input stage, from setting the voltage level of the intermediary input node in accordance with the state of the input signal.

* * * * *